United States Patent [19]
Patterson

[11] Patent Number: 5,936,430
[45] Date of Patent: Aug. 10, 1999

[54] PHASE DETECTION APPARATUS AND METHOD

[75] Inventor: Jeffery S. Patterson, Santa Rosa, Calif.

[73] Assignee: Hewlett-Packard Company, Palo Alto, Calif.

[21] Appl. No.: 08/897,664

[22] Filed: Jul. 21, 1997

[51] Int. Cl.$^6$ .............................. H03K 5/26; H03D 13/00
[52] U.S. Cl. .......................... 327/12; 327/159; 327/225; 331/1 A; 331/25; 324/76.82
[58] Field of Search ................................. 327/12, 3, 156, 327/159, 225; 331/25, 1 A; 324/76.82

[56] References Cited

U.S. PATENT DOCUMENTS

| | | | |
|---|---|---|---|
| 3,646,455 | 2/1972 | Coccagna | 324/76.82 |
| 4,519,091 | 5/1985 | Chu et al. | 377/44 |
| 5,266,851 | 11/1993 | Nukui | 327/12 |
| 5,373,255 | 12/1994 | Bray et al. | 327/7 |
| 5,422,918 | 6/1995 | Vartti et al. | 327/12 |
| 5,539,345 | 7/1996 | Hawkins | 327/12 |
| 5,736,872 | 4/1998 | Sharma et al. | 327/3 |

FOREIGN PATENT DOCUMENTS

| | | | |
|---|---|---|---|
| 2027295A | 2/1980 | United Kingdom | H03D 13/00 |

Primary Examiner—Timothy P. Callahan
Assistant Examiner—Terry L. Englund
Attorney, Agent, or Firm—John L. Imperato

[57] ABSTRACT

A phase detection apparatus produces a phase difference signal in response to the phase difference between two applied input signals. The phase detector includes a lead/lag indicator receiving the input signals, and a logic block receiving the input signals. The logic block generates an output signal in response to the time delay between corresponding amplitude transitions, such as rising edges, of each of the input signals. The lead/lag indicator records which one of the two input signals leads in phase and generates an enable signal that steers the output signal from the logic block to one or the other of the phase detector's two output terminals. A phase detection method generates an output signal corresponding to the phase difference between a pair of input signals by recording which one of the input signals leads in phase relative to the other of the input signals, generating a pulse having a pulse width equal to the time delay between corresponding amplitude transitions of the input signals, delaying the pulse and then steering the pulse to one of the output terminals according to which one of the input signals is recorded as leading in phase.

13 Claims, 4 Drawing Sheets

PHASE DETECTION APPARATUS AND METHOD

BACKGROUND OF THE INVENTION

Phase detectors are an essential component of phase-lock-loops (PLLs) which are used in a variety of communication systems. One type of phase detector uses a pair of flip-flops that each receive an input signal and each generate an output signal. The phase detector relies on the common-mode rejection of circuitry within the PLL to extract a differential output pulse from the two output signals. The differential output pulse has a pulse width equal to the time delay between the input signals which indicates the phase difference between the input signals. High performance of the communication system is dependent on high common-mode rejection of the circuitry in the PLL, which is difficult to maintain over a wide signal bandwidth. This type of phase detector is also susceptible to spurious signals from power supplies and other sources which produce unwanted differential-mode spurious signals at the outputs of the flip-flops. The circuitry coupled to the flip-flops is responsive to differential-mode signals in order to extract the differential output pulse, but the circuitry also responds to the unwanted differential-mode spurious signal, degrading the performance of the communication system in which this type of phase detector is used. In addition, mismatches in propagation delays through the flip-flops also generate differential-mode spurious signals, further degrading the system's performance.

SUMMARY OF THE INVENTION

According to the preferred embodiment of the present invention, a phase detector includes a pair of flip-flops and a logic block to isolate spurious signals from the phase detector's output. Each of the flip-flops receives one of the input signals applied to the phase detector. The logic block receives both of the input signals and generates an output signal in response to the time delay between corresponding amplitude transitions, such as rising edges, of each of the input signals. The flip-flops record which one of the two input signals leads in phase and steer the output signal to one or the other of the phase detector's two output terminals. When the output signal is present at one of the output terminals, no output signal is present at the other output terminal. As a result, performance of the system in which the phase detector is used does not rely upon common-mode rejection of circuitry coupled to the output terminals of the phase detector.

A pair of gates, each coupled to one of the output terminals and to one of the flip-flops steers the output signal to the appropriate output terminal. The logic block is coupled to both gates. The flip-flop receiving the input signal that leads in phase generates an enable signal that is applied to the gate to which the flip-flop is coupled, allowing the output signal from the logic block to pass to the output terminal coupled to that gate. The logic block delays the output signal so that the appropriate gate is enabled before the output signal reaches the gates. The enabled gate changes its output state in response to the later-arriving output signal, causing spurious signals from the flip-flops to be suppressed at the phase detector's output terminals, improving the performance of the system in which the phase detector is used.

DETAILED DESCRIPTION OF THE PREFERRED EMBODIMENT

Figure 1:
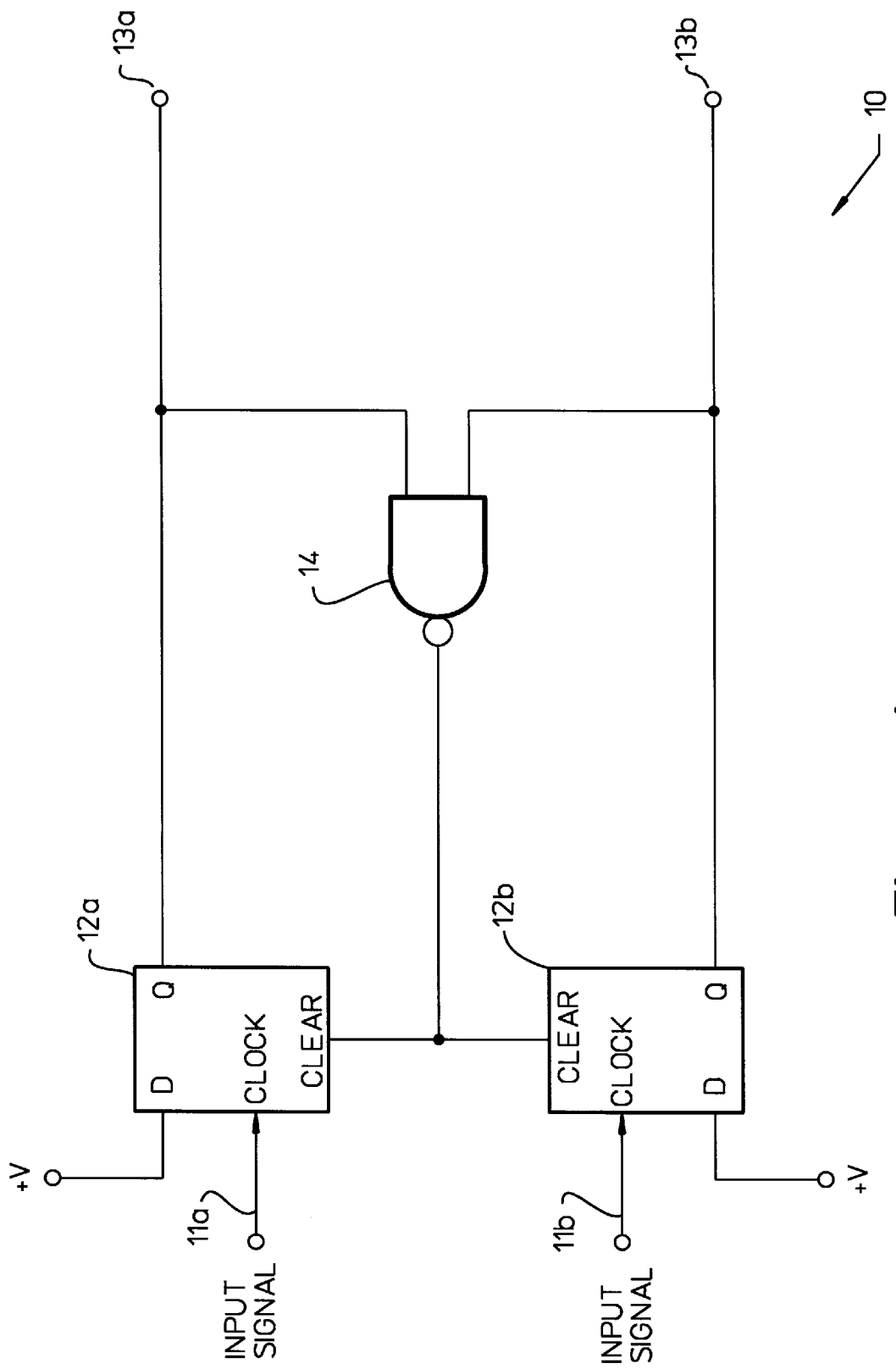
FIG. 1 shows a prior art phase detector.

FIG. 1 shows a prior art phase detector 10 including a pair of D flip-flops 12a, 12b and a NAND gate 14, used to reset the flip-flops. Each of the flip-flops receives an input signal 11a, 11b. The rising edge of the input signal that leads in phase, for example input signal 11a, sets the Q output 13a of the corresponding flip-flop 12a to the HIGH state. The rising edge of the input signal that lags in phase, for example input signal 11b, then sets the Q output 13b of the second flip-flop 12b to the HIGH state. Once the Q output 13b of the second flip-flop 12b transitions to the HIGH state, the output of the NAND gate 14 clears both of the flip-flops 12a, 12b, thereby driving the Q outputs of both flip-flops to the LOW state.

Figure 2:
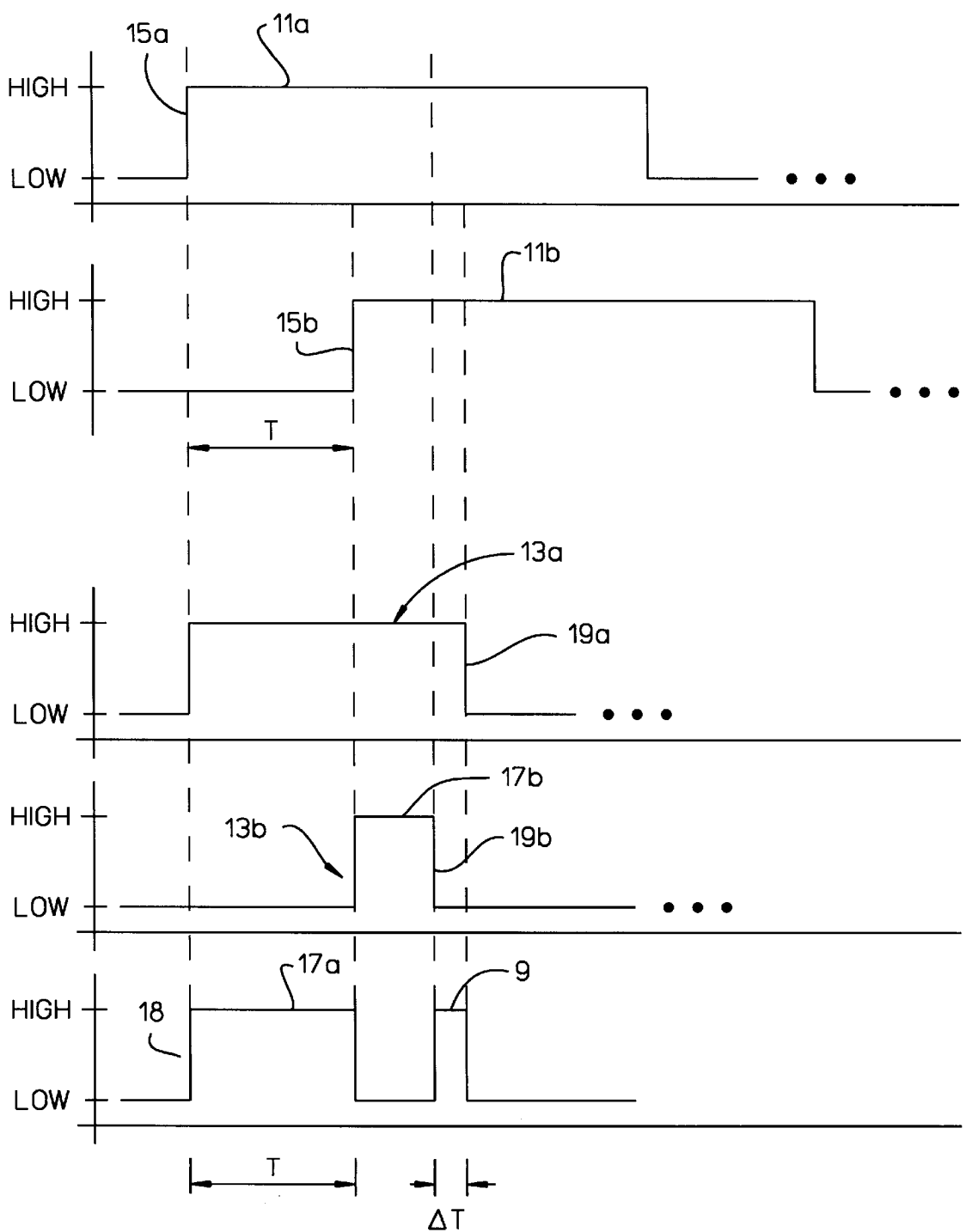
FIG. 2 shows a timing diagram for the prior art phase detector.

FIG. 2 shows a timing diagram that includes the waveforms of the input signals 11a, 11b applied to the phase detector 10 and the waveforms of the resulting Q outputs 13a, 13b. The time delay T between rising edge 15a of the leading input signal 11a and the rising edge 15b of the lagging input signal 11b results from the phase difference between the input signals. For example, when the flip-flop 12b receives the input signal 11b that lags in phase, the flip-flop generates a reset pulse 17b at its Q output 13b, once the flip-flops 12a, 12b are cleared by the output of the NAND gate 14. The differential output signal 18 from the phase detector 10, is the difference between the Q output 13a of the flip-flop 12a and the Q output 13b of the flip-flop 12b, which is an output pulse 17a having a pulse width T equal to the time delay T between rising edge 15a of the leading input signal 11a and rising edge 15b of the lagging input signal 11b. It is this pulse width T that corresponds to the phase difference between the leading input signal 11a and lagging input signal 11b. However, due to differences in internal delays between the clear input CLEAR and the Q outputs 13a, 13b within of each the flip-flops 12a, 12b, the falling edge 19a of the Q output 13a does not always occur at the same time as the falling edge 19b of the Q output 13b. Although both flip-flops 12a, 12b are cleared by the output of the NAND gate 14 at the same time, the difference in internal delays and modulation of switching thresholds caused by spurious signals on the power supply +V cause the falling edges 19a, 19b of the Q outputs 13a, 13b to become offset in time by a time duration ΔT. The non-coincidental falling edges 19a, 19b produce a differential-mode glitch signal 9 in addition to the output pulse 17a of the output signal 18.

The Q outputs 13a, 13b from the flip-flops 12a, 12b are also susceptible to unwanted spurious signals from power supplies and other sources. For example, spurious signals present at the flip-flop 12b are sampled by the reset pulse 17b, while spurious signals coupled to the other flip-flop 12a are sampled by the other Q output 13a, resulting in differential-mode spurious signals between the outputs of the flip-flops 12a, 12b. Circuitry (not shown) coupled to the phase detector in a PLL or communication system, receiving the differential output, responds not only to the desired output pulse 17a, which indicates the phase difference between the applied input signals 11a, 11b, but also responds to the differential-mode spurious signals, thereby degrading the performance of the system in which the phase detector 10 is used. The glitch signal 9 also produces unwanted spurious signals which may decrease the performance of phase-lock-loops or other communication systems in which the phase detector 10 is used.

Figure 3:
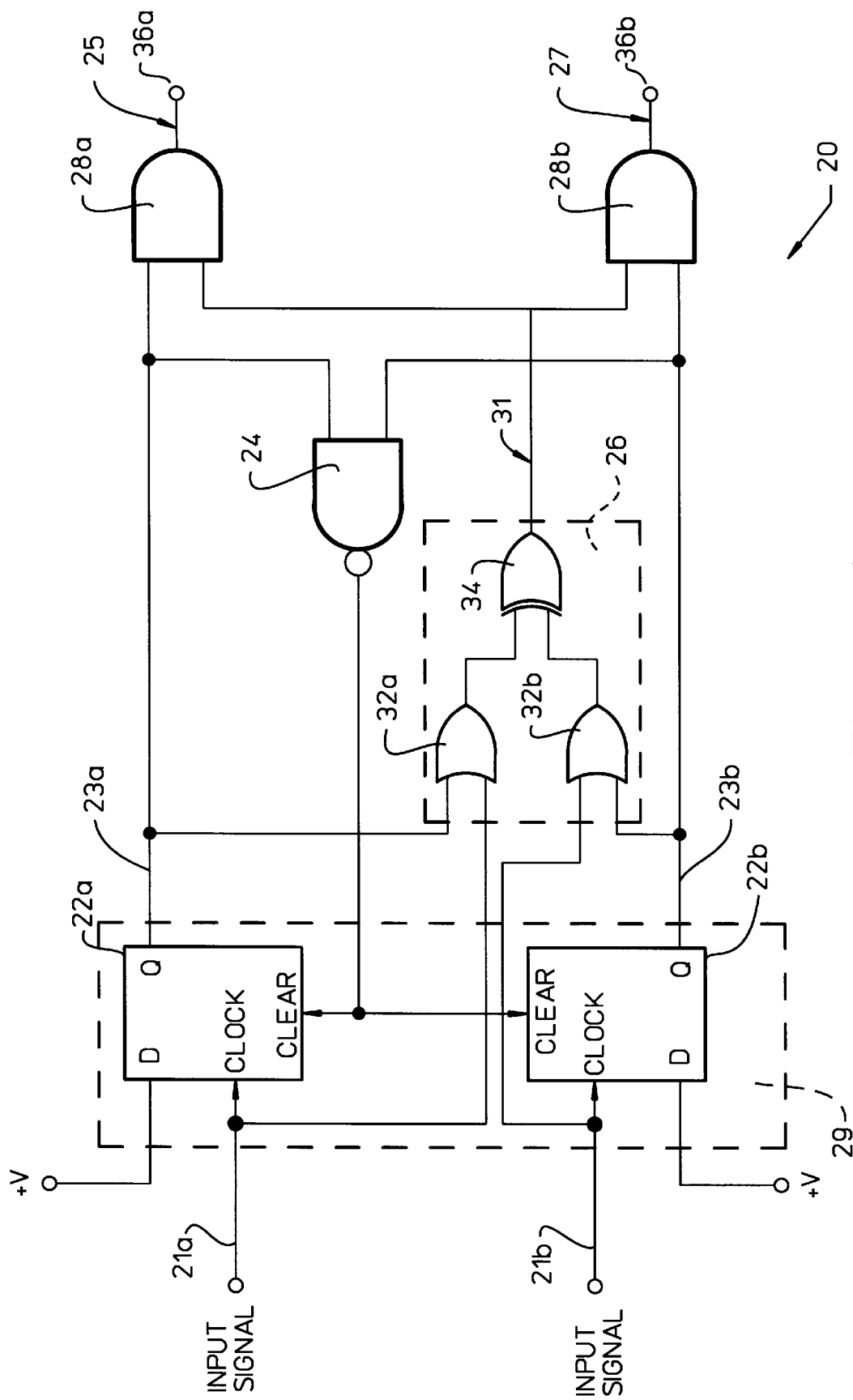
FIG. 3 shows a phase detector constructed according to the preferred embodiment of the present invention.

FIG. 3 shows a phase detector 20 constructed according to the preferred embodiment of the present invention. The phase detector 20 has a lead/lag indicator 29 that includes a pair of flip-flops 22a, 22b used to record which input signal of the two input signals 21a, 21b leads in phase relative to the other input signal. A logic block 26 provides a signal 31 that indicates the duration of the time delay τ between corresponding amplitude transitions, such as rising edges, of each of the input signals 21a, 21b. This time delay τ corresponds to the magnitude of the phase difference between the applied input signals 21a, 21b. The Q output of each of the flip-flops 22a, 22b is applied to a corresponding one of a pair of output gates 28a, 28b and the signal 31 from the logic block 26 is applied to both output gates 28a, 28b. The Q outputs steer the signal 31 to a corresponding one of the output gates 28a, 28b which in turn passes the signal 31 to form an output signal 25,27 at one of the output terminals 36a, 36b.

Each of the flip-flops 22a, 22b in the phase detector 20 receives one of the two input signals 21a, 21b. The logic block 26 receives both input signals 21a, 21b. When the input signal 21a leads in phase relative to the input signal 21b, the rising edge of the input signal 21a sets the Q output 23a of the flip-flop 22a to which it is applied, to the HIGH state. This Q output 23a of the flip-flop 22a is then coupled to a first input of the output gate 28a. The logic block 26 also responds to the rising edge of the input signal 21a to produce the signal 31 that is applied to a second input of each of the output gates 28a, 28b, but propagation through the logic block 26 takes longer than propagation through each of the flip-flops. Due to the longer propagation delay through the logic block 26, the Q output 23a of the flip-flop 22a changes state before the signal 31 of the logic block 26 changes state. Once the output 23a of the flip-flop 22a is in the HIGH state, the output gate 28a does not transition to the HIGH state until the signal 31 from the logic block 26 transitions to the HIGH state. Thus, when the input signal 21a leads in phase, the output gate 28a is enabled by the Q output 23a of the flip-flop 22a, but the timing of the transitions from the LOW state to the HIGH state of the output signal 25 at the output terminal 36a of output gate 28a is determined by the signal 31 of the logic block 26. Similarly, when the input signal 21b leads in phase, the output gate 28b is enabled by the Q output 23b of the flip-flop 22b, but the timing of the transitions from the LOW state to the HIGH state of the output signal at the output terminal 36b of output gate 28b is determined by the signal 31 of the logic block 26.

The signal 31 of the logic block 26 remains in the HIGH state until the rising edge of the input signal 21b propagates through the logic block 26 and drives the signal 31 of the logic block 26 to the LOW state. Once the signal 31 from the logic block 26 is in the LOW state the output signal 25 transitions to the LOW state. Once the input signal 21b sets the Q output 23b of the flip-flop 22b to the HIGH state, the reset gate 24 clears the two flip-flops 22a, 22b, driving the Q outputs 23a, 23b of the flip-flops to the LOW state.

In this example, the logic block 26 includes a pair of OR gates 32a, 32b coupled to an exclusive OR (XOR) gate 34. The Q output 23a of flip-flop 22a is coupled to the OR gate 32a in the logic block 26. The Q output 23b of flip-flop 22b is coupled to the OR gate 32b in the logic block 26. The Q output 23a of the flip-flop 22a, receiving the input signal that leads in phase (for example, input signal 21a) maintains one input to the XOR gate 34 in the HIGH state. Thus, the signal 31 at the output of the XOR gate 34 is at the HIGH state, which produces the HIGH state at output signal 25 at output terminal 36a, until the falling edge of the input signal 21b, which lags in phase, is presented. This falling edge sets the Q output 23b of flip-flop 22b to the HIGH state and when the edge propagates through the OR-XOR path in the logic block 26, the signal 31 at the output of the XOR gate 34 is driven to the LOW state, in turn, driving the output signal 25 at the output terminal 36a to the LOW state.

Figure 4:
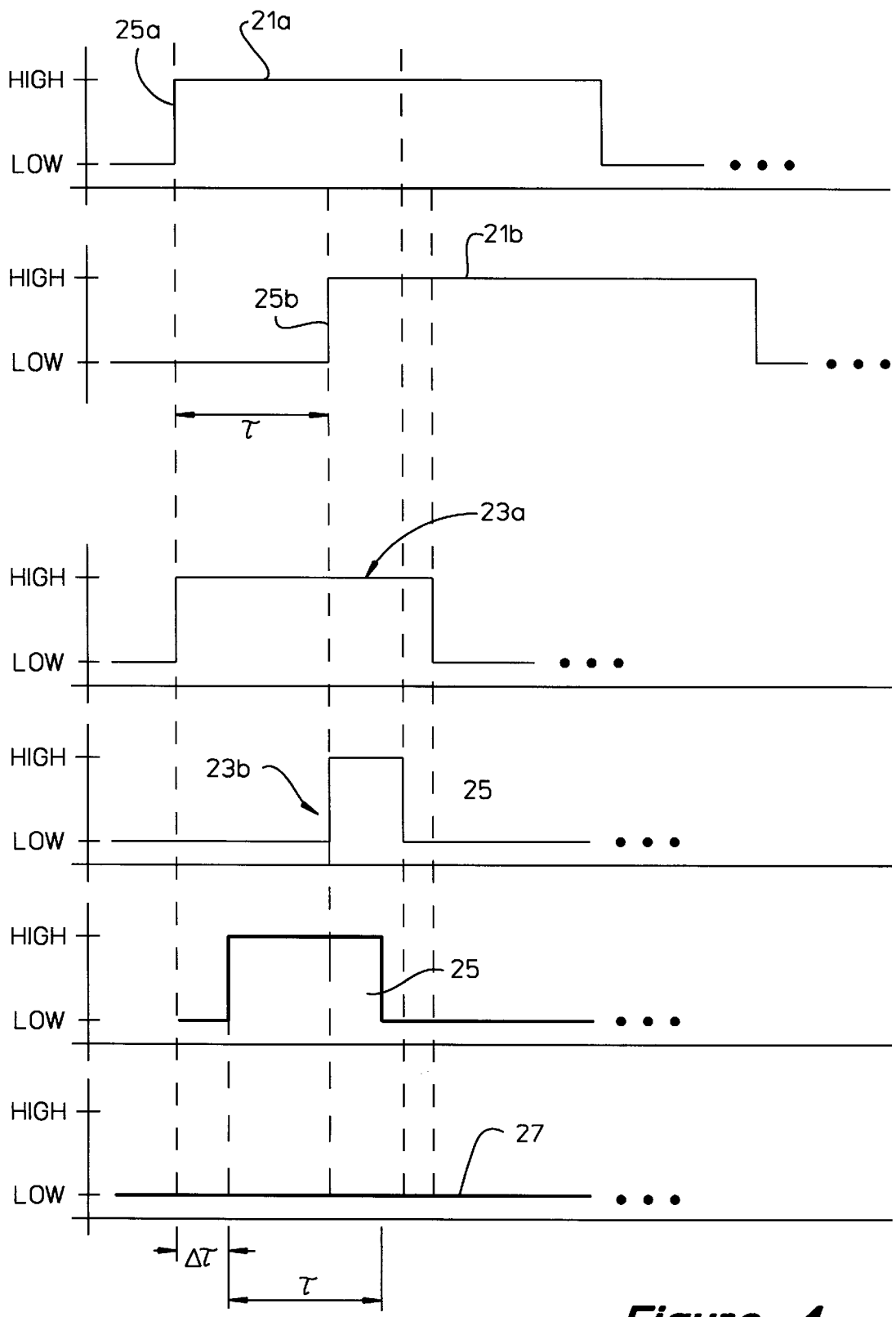
FIG. 4 shows a timing diagram for the phase detector of FIG. 3.

FIG. 4 shows a timing diagram for the phase detector 20. In this example, the input signal 21a leads in phase relative to the input signal 21b, and the output signal 25 at output terminal 36a of the phase detector 20 has a pulse width τ, equal to the duration of the time delay τ between corresponding amplitude transitions of the input signals, such as rising edge 25a of input signal 21a and rising edge 25b of input signal 21b. When the input signal 21a leads in phase, the output signal 27 at terminal 36b of the phase detector 20 remains in the LOW state. Similarly, when the input signal 21b leads in phase (not shown), the output signal at terminal 36a of the phase detector 20 remains in the LOW state, while the output signal at terminal 36b has pulse width equal to the time delay τ between corresponding amplitude transitions of the input signals 21a, 21b. Since one of the output signals at the output terminals 36a, 36b remains in the LOW state while the other is in the HIGH state, common-mode signals between output terminals 36a, 36b are not present. The absence of common-mode signals, in turn, reduces reliance of system performance on common-mode rejection of circuitry (not shown) connected to the output terminals 36a, 36b of the phase detector 20. Typically, the circuitry in a PLL or communication system coupled to the phased detector 20 is responsive to differential-mode signals between the output terminals 36a, 36b.

Because the flip-flops 22a, 22b direct, or steer, the signal 31 from logic block 26 to one of the pair of output gates 28a, 28b before the signal 31 from the logic block 26 transitions between LOW and HIGH states, a buffer interval Δτ is formed between the time that the state transitions of the Q outputs 23a, 23b of the flip-flops 22a, 22b occur and the time that the state transition at the one of the output terminals 36a, 36b of phase detector 20 occur. This buffer interval Δτ isolates the differential output between output terminal 36a and output terminal 36b from the Q outputs 23a, 23b of the flip-flops 22a, 22b. Thus, spurious signals and jitter introduced in the timing of the amplitude transitions of the Q outputs 23a, 23b by power supplies or other sources is not present on the differential output between output terminals 36a, 36b of the phase detector 20. This isolation provides immunity to spurious signals at the outputs 36a, 36b of the output gates 28a, 28b and is especially beneficial when the phase detector is used in fractional-N type phase-lock-loops, which are inherently noisy and which generate high level spurious signals on the PLL's power supplies. The buffer interval Δτ also reduces the effect of mismatches in the internal delays between the CLEAR inputs of the flip-flops 22a, 22b and the corresponding Q outputs 23a, 23b, thereby reducing the level of spurious signals at the output terminals 36a, 36b of the phase detector 20.

D flip-flops are shown in the preferred embodiment of the present invention. Alternatively, the lead/lag indicator 29 is implemented using other types of latches in place of the D flip-flops to receive the input signals and to indicate which of the input signals leads or lags in phase relative to the other of the input signals. The lead/lag indicator 29 receives the input signals 21*a*, 21*b* and provides a pair of output signals as shown in the preferred embodiment of the present invention, or alternatively, the lead/lag indicator provides a single output signal having a first output state, such as the HIGH state, when the first input signal 21*a* leads in phase relative to the second input signal 21*b*, and having a second output state, such as the LOW state, when the first input signal 21*a* lags in phase relative to the second input signal 21*b*. The lead/lag indicator 29 is clocked by rising edges, falling edges, zero crossings or other corresponding amplitude transitions of the input signals 21*a*, 21*b*. In the preferred embodiment of the present invention, the output gates 28*a*, 28*b* are implemented using a pair of AND logic gates. Alternatively, other types of circuitry is used to steer the signal 31 from the logic block to one or the other of the output terminals 36*a*, 36*b* according to the output signal provided by the lead/lag indicator 29 which indicates which of the two input signals 21*a*, 21*b* leads in phase.

What is claimed is:

1. A phase detector, producing a phase difference signal at one of a pair of output terminals, responsive to the phase difference between a first input signal and a second input signal, comprising:

a lead/lag indicator receiving the first input signal and the second input signal and generating an enable signal according to which one input signal of the two input signals leads in phase relative to the other of the input signals;

a logic block receiving the first input signal and the second input signal and generating an output signal according to a time delay between corresponding amplitude transitions of the first input signal and the second input signal, the logic block delaying the output signal relative to the enable signal; and a gate coupled to the output terminals and to the logic block and to the lead/lag indicator, receiving the enable signal and the output signal and steering the output signal to the one of the output terminals designated by the enable signal to provide the phase difference signal.

2. The phase detector of claim 1 wherein the output signal is a pulse having a pulse width equal to the time delay between corresponding amplitude transitions of the first input signal and the second input signal.

3. The phase detector of claim 2 wherein the lead/lag indicator includes a pair of flip-flops, each flip-flop receiving a different one of the two input signals, and wherein the enable signal includes;

a first signal provided by a first flip-flop in the pair of flip-flop having a first output state when the first input signal leads in phase relative to the second input signal and having a second output state when the first input signal lags in phase relative to the second input signal, and a second signal provided by a second flip-flop in the pair of flip-flop having a first output state when the second input signal leads in phase relative to the first input signal and having a second output state when the second input signal lags in phase relative to the first input signal.

4. The phase detector of claim 3 wherein the corresponding amplitude transitions comprise the rising edges of the first input signal and the second input signal, and the first flip-flop is clocked by the rising edge of the first input signal and the second flip-flop is clocked by the rising edge of the second input signal.

5. The phase detector of claim 4 further comprising a reset gate coupled to the first flip-flop and the second flip-flop, clearing the first flip-flop and the second flip-flop when the first flip-flop is clocked by the rising edge of the first input signal and the second flip-flop is clocked by the rising edge of the second input signal.

6. The phase detector of claim 4 wherein the gate includes a pair of output gates comprising;

a first output gate, coupled to a first output terminal in the pair of output terminals and to the first flip-flop, for receiving the first signal at a first input and receiving the output signal at a second input, and a second output gate, coupled, to a second output terminal in the pair of output terminals and to the second flip-flop, for receiving the second signal at a first input and receiving the output signal at a second input, and wherein the first output gate is enabled when the first signal has the first output state and the second output gate is enabled when the second signal has the first output state.

7. The phase detector of claim 6 wherein the first output gate provides a LOW output state when the second output gate is enabled and the second output gate provides a LOW output state when the first output gate is enabled.

8. The phase detector of claim 7 wherein the logic block includes:

a first logic gate coupled to the first flip-flop, receiving the first input signal and the first signal, producing a HIGH output in response to at least one of the rising edge of the first input signal and the rising edge of the first signal;

a second logic gate coupled to the second flip-flop, receiving the second input signal and the second signal, producing a HIGH output in response to at least one of the rising edge of the second input signal and the rising edge of the second signal; and a third logic gate coupled to the first logic gate and the second logic gate, the third logic gate generating the output signal, having the HIGH output when one of the first logic gate and the second logic gate produces the HIGH output.

9. A phase detector, producing a phase difference signal at one of a pair of output terminals, responsive to the phase difference between a first input signal and a second input signal, comprising:

a first flip-flop receiving the first input signal and generating a first signal having a HIGH output in response to a rising edge of the first input signal;

a second flip-flop receiving the second input signal and generating a second signal having a HIGH output in response to a rising edge of the second input signal;

a logic block receiving the first input signal and the second input signal and generating an output pulse having a pulse width equal to the time duration between the rising edge of the first input signal and the rising edge of the second input signal, the logic block delaying the output pulse relative to the first signal and the second signal;

a first gate coupled to a first output terminal in the pair of output terminals and the first flip-flop and the logic block, receiving the first signal and the output pulse, providing the output pulse at the first output terminal when the first signal has the HIGH output; and a second gate coupled to a second output terminal in the pair of output terminals and the second flip-flop and the logic block, receiving the second signal and the output pulse, providing the output pulse at the second output terminal when the second signal has the HIGH output.

10. The phase detector of claim 9 further comprising a reset gate coupled to the first flip-flop and the second flip-flop, receiving the first signal and the second signal and clearing the first and second flip-flops when the first signal and the second signal have the HIGH output.

11. A method for generating a phase difference signal corresponding to the phase difference between a pair of input signals, comprising the steps of:

recording which one of the input signals leads in phase relative to the other of the input signals;

generating an output signal, delayed relative to the one of the input signals that leads in phase, and having a duration equal to the magnitude of the time delay between corresponding amplitude transitions of the input signals; and steering the output signal to one of a pair of output terminals according to the recorded one of the input signals leading in phase.

12. The method of claim 11 wherein the corresponding amplitude transitions of the input signals comprise the rising edge of the first input signal and the rising edge of the second input signal.

13. The method of claim 11 further comprising the step of resetting the recorded signal to a predetermined level when the rising edge of the input signal lagging in phase is recorded.

* * * * *

UNITED STATES PATENT AND TRADEMARK OFFICE
CERTIFICATE OF CORRECTION

PATENT NO. : 5,936,430
DATED : August 10, 1999
INVENTOR(S) : Jeffery S. Patterson It is certified that error appears in the above-identified patent and that said Letters Patent is hereby corrected as shown below:

Column 4, lines 6 and 7, "falling", should read -- rising --.

Signed and Sealed this

Eighteenth Day of April, 2000

Attest:

Q. TODD DICKINSON

*Attesting Officer*       *Director of Patents and Trademarks*